United States Patent [19]
Heuser et al.

[11] 4,109,162
[45] Aug. 22, 1978

[54] MULTI-STAGE INTEGRATED INJECTION LOGIC CIRCUIT WITH CURRENT MIRROR

[75] Inventors: Rolf Heuser, Ellerau, Fed. Rep. of Germany; George Albert Govaert, Eindhoven, Netherlands

[73] Assignee: U.S. Philips Corporation, New York, N.Y.

[21] Appl. No.: 717,194

[22] Filed: Aug. 24, 1976

[30] Foreign Application Priority Data
Sep. 2, 1975 [DE] Fed. Rep. of Germany ....... 2538910

[51] Int. Cl.² ............................................. H03K 19/08
[52] U.S. Cl. .............................. 307/203; 307/296 A; 307/299 B; 357/92
[58] Field of Search .................. 307/213, 296, 299 R, 307/299 B, 303, 203; 357/44, 46, 92

[56] References Cited
U.S. PATENT DOCUMENTS

| | | | |
|---|---|---|---|
| 3,916,218 | 10/1975 | Berger et al. | 307/213 |
| 4,007,385 | 2/1977 | Chapron | 307/296 |

OTHER PUBLICATIONS

Berger et al., "Merged Transistor Logic With Power Driver" IBM Tech. Disclos. Bull., vol 15, No. 5 (10/72), pp. 1626–1627.
K. Hart et al., "Integrated Injection Logic: A New Approach to LSI", IEEE Journ. Solid State Circuits, vol. SC-7 (10/72), pp. 346–351.

*Primary Examiner*—Stanley D. Miller, Jr.
*Attorney, Agent, or Firm*—Frank R. Trifari; Daniel R. McGlynn

[57] ABSTRACT

An I²L circuit comprising plural stages connected in series across a supply voltage. In order to reduce the turn-off time of a switching transistor in a lower stage actuated by a signal from a higher stage, a current mirror is coupled to the base of the switching transistor.

5 Claims, 4 Drawing Figures

MULTI-STAGE INTEGRATED INJECTION LOGIC CIRCUIT WITH CURRENT MIRROR

The invention relates to an integrated injection logic ($I^2L$) circuit.

More particularly, it relates to an $I^2L$ circuit comprising switching transistors whose bases are connected to current injectors and to a collector of one or more further transistors, with the circuit being divided into several circuit stages series-connected across a supply voltage. Signal transfer between a first or higher stage of the circuit and a second or lower stage of the circuit is accomplished by connecting the collector of a first transistor in the higher stage, which supplies the signal, via a complementary auxiliary transistor to the base of a second transistor in a lower stage.

Such circuits are known and are described in the published DT-OS No. 2443171 and in the corresponding U.S. Pat. No. 4,007,385, the contents of which are hereby incorporated by reference. It is noted that the term "stages" as used herein has the same meaning as the term "storeys" used in that U.S. Pat. Similarly to the patent, the term "upper stage" as used herein means that circuit stage of the series connected stages which is connected closer in the series to one terminal of the voltage supply, and the term "lower stage" means a circuit stage of the series which is connected more remote from the same one terminal of the voltage supply. The terms "upper" and "lower" do not necessarily signify physical locations, but rather the electrical relationship of the series-connected stages to the voltage supply.

This known circuit has the drawback that, although the second transistor in the lower stage can be rapidly turned on by the auxiliary transistor, when the auxiliary transistor is turned off at least the base stored charge of the second transistor which receives the transferred signal cannot be rapidly drained, so that the second transistor turns off too slowly, with the result that high switching speeds at least for the relevant signal edges cannot be realized.

It is a principal object of the present invention to provide an $I^2L$ circuit of the above-mentioned type in which signal transfer from an upper stage to a lower stage is effected with essentially the same speed as signal transfer between transistors in the same stage.

In accordance with the invention, this object is achieved by providing means connected to the base of the second transistor in the lower level for draining off its base stored charge when it is turned off. In a preferred embodiment, the charge drain means comprises a current mirror. In a specific embodiment, the current mirror comprises in the lower stage a third transistor whose collector is connected to the second transistor base and whose base is connected to the collector of a second auxiliary transistor and is driven by a signal inverted with respect to that driving the second transistor, the third transistor being connected up as a current mirror by connecting a second collector thereof directly to its base. Thus, in addition to the normal signal to be transferred, the complementary or inverted signal is also transferred to the lower situated stage, which involves practically negligible additional cost in view of the large number of transistors in each circuit and the small number of connections which are required between the circuit stages for the usual circuit layout. The auxiliary transistors are readily controlled by connecting the collector of the transistor in the upper level to the emitter of the auxiliary transistor and also to a current injector, the base of the auxiliary transistor being connected to the emitter of the upper stage transistor, i.e., to a reference voltage. This circuit arrangement is particularly simple and can be integrated in compact form.

Preferred embodiments of the invention will now be described in more detail with reference to the accompanying drawings, wherein.

Figure 1A:
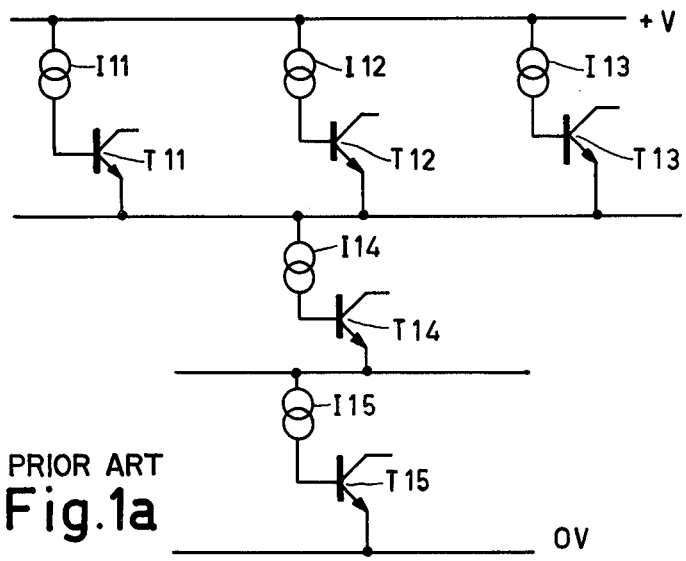
FIG. 1a shows a schematic circuit arrangement of the $I^2L$ type to which the invention pertains divided into several stages connected in series across a voltage supply.

FIG. 1 shows an $I^2L$ circuit which comprises three stages connected in series across a supply voltage, so that, as is known from the above-noted U.S. Pat. No. 4,007,385 a higher supply voltage can be utilized in an optimum manner, i.e., so as to save power. In the upper stage, which in the present instance is connected directly to the supply voltage more positive terminal $+V$, three circuit stages are connected in parallel, which are represented by the transistors T11, T12, and T13. Not shown are the typical intra-stage connections between collectors of a preceding stage to the bases of subsequent stages. Each circuit stage comprises current injectors which are simply represented by the current generators I11, I12 and I13. Connected in series with this parallel-connected upper stage are lower circuit stages which are represented by the transistors T14 and T15 with their associated current injectors I14 and I15. Thus, in this circuit arrangement the total current which flows through the upper parallel connected circuit stage flows through each of the two lower circuit stages which are connected in series therewith. As the limit frequency or the switching speed of the transistors depends on the magnitude of the injection current, the parallel connected circuit stages in the upper stage will operate more slowly than the lower circuit stages. This is not troublesome and can, for example, be effective in divider circuits, in which the first stages should obviously operate faster than the subsequent stages.

Figure 1B:
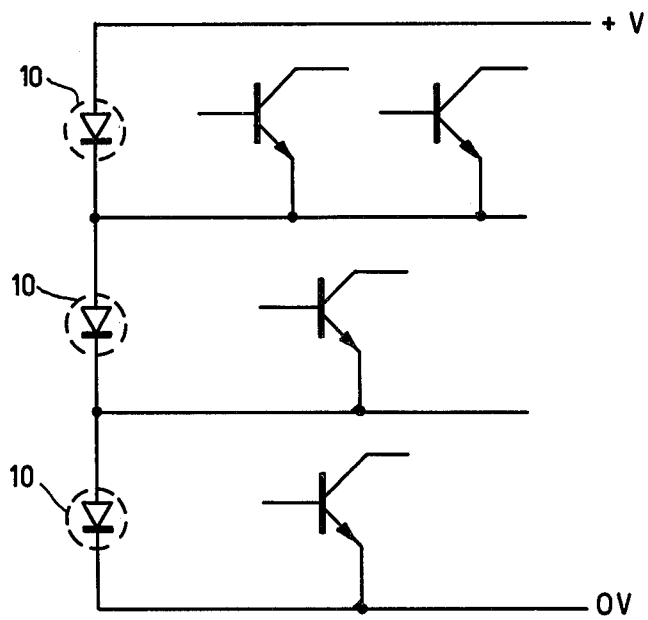
FIG. 1b illustrates the series connection of the current injectors.

The series connection of the stages will be more clearly understood when it is noted that the typical current injectors (see, for instance, IEEE JSSC Vol. SC-7, No. 5, pgs. 340-351, and Electronics, Oct. 3, 1974, pgs. 111-118), when the switching transistors are NPN types, are complementary PNP transistors whose P emitters and N bases are connected, respectively, to the more positive and less positive sides of the voltage supply, the complementary P collector being typically merged with the P base of the NPN switching transistor it activates. FIG. 1b shows a multi-stage $I^2L$ circuit similar to that of FIG. 1a but with the PN emitter-base diodes of the complementary PNP transistors illustrated by P-N diodes 10 to show more clearly the series connection of the stages across the voltage supply. This same form of illustration has been employed in the earlier-referenced U.S patent. The anode of each of the diodes 10 corresponds to the emitter of the complementary PNP transistor, and the cathode of each of the diodes 10 corresponds to the base region of that PNP transistor. As shown, typically the complementary transistor base is connected to the switching transistor emitter. The complementary transistor collector is typically merged with the switching transistor base regions in that same stage.

In the case of a layout of an I²L circuit as illustrated in FIG. 1, signal connections are generally necessary between the individual circuit stages. The signal connections between the circuit stages in the same stage obviously present no problems. Signal connections from a lower stage to a higher stage neither present any problems, because the collectors of the transistors in a lower stage (for example the collector of the transistor T15) can be connected directly to the base of a transistor in a higher stage (for example transistor T13), provided that the maximum permissible collector reverse voltage is not exceeded. Otherwise a transistor must be included in an intermediate stage, which however does not appreciably reduce the switching speed. It is also possible to connect collectors of the transistors of different stages to the base of the same transistor in an upper stage, so as to obtain a desired logic function.

The transfer of a signal from a higher stage to a lower stage, however, is more difficult, as will be explained with reference to FIG. 2. In this Figure, transistor T1 is a switching transistor in the upper stage, I1, I2, I3 and I4 are current injectors in the upper stage, and transistor T2 is a switching transistor in a lower stage. The transistor T1 receives a signal A to be transferred. The base of this transistor is connected to a current injector I1, and a collector of this transistor leads to the emitter of an auxiliary transistor HT1, which is controlled by the transistor T1, and which moreover is connected to a further current injector I3. In the present example, the auxiliary transistor is a PNP transistor, which is consequently of a conductivity type opposite or complementary to that of the controlling NPN-transistor T1. The base of the auxiliary transistor HT1 is connected to the emitter of the controlling transistor, i.e., to a reference voltage. The second collector of the controlling transistor T1 as well as the further transistors in this stage will be ignored for the time being.

The collector of the auxiliary transistor HT1 is connected to the base of the switching transistor T2 in the lower stage via a conductor P. As is explained in U.S. Pat. No. 4,007,385, cited on page 2, in contradistinction to other switching transistors in this lower stage, the base of transistor T2 is not connected to a current injector located in that lower level, otherwise it would latch-up into a conductive condition, i.e., it would not be possible to switch off this lower transistor T2. Moreover, level shifting of the signal is unnecessary because auxiliary transistor HT1 provides current rather than voltage drive for transistor T2. If it is now assumed that the signal A has a high level, the transistor T1 is turned on by the current injector I1, and its collector thus sinks the current from the current injector I3. Consequently, the auxiliary transistor HT1 is cut-off; with no current drive along conductor P transistor T2 is cut-off. If the signal A now assumes a low level, the transistor T1 is cut-off and the current of the current injector I3 then flows through the auxiliary transistor HT1 to the base of the transistor T2 and rapidly turns on the latter, so that at its collector the signal A appears with only a slight delay. If subsequently the signal A assumes its high level again, the transistor T1 is rapidly turned on by the current injector I1 and shunts the current from the current injector I3, so that the current in the conductor P rapidly disappears, but the base stored charge of transistor T2 is not drained, so that its collector current decreases only slowly and thus this edge of the signal A only appears at its collector after a substantial delay, thus substantially increasing the overall transfer time for the signal A to the lower stage.

Figure 2:
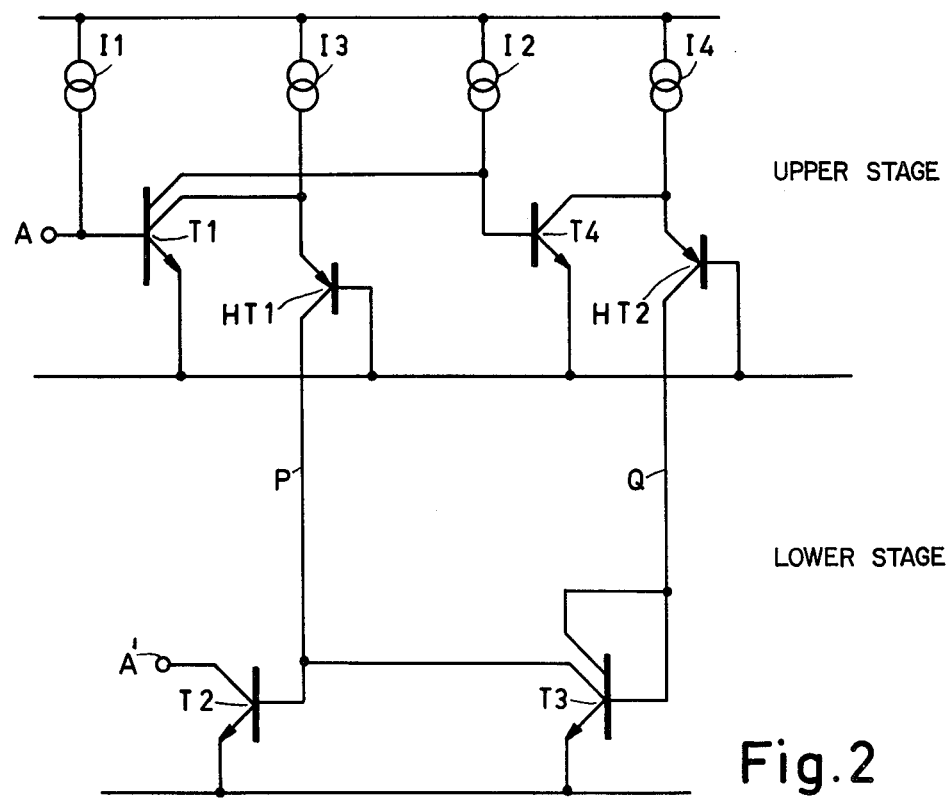
FIG. 2 shows one form of circuit arrangement in accordance with the invention for transferring a signal from a higher to a lower stage.

This transfer time can be substantially reduced in accordance with the invention by means of the additional elements which are shown in FIG. 2. In this Figure, a second collector of the controlling transistor T1 is connected to the base of a fourth transistor T4 and to a current injector I2. The collector of this transistor T4 is connected to a further current injector I4 and to the emitter of a second complementary auxiliary transistor HT2, whose base is connected to the emitter of its controlling transistor T4. The collector of this second auxiliary transistor is connected to the base of a third transistor T3 in the lower stage. A first collector of this transistor T3 is connected to its base and a second collector to the base of the transistor T2 and thus to the collector of the first auxiliary transistor HT1. The transistor T3 thus operates as a current mirror, which compares the collector currents of the two auxiliary transistors HT1 and HT2 in the conductors P and Q with each other, i.e., if a smaller current flows in the conductor P than in the conductor Q, the collector of the transistor T3 which is connected to the conductor P can drain a current which corresponds to this current difference from the base of the transistor T2 for the purpose of discharging or turning it off. However, if the current in the conductor P is greater than that in the conductor Q, a base current which corresponds to this current difference is available for turning on the transistor T2. Thus, the current mirror circuit also ensures that the transistor T2 switches over also in the case of comparatively large leakage residual currents through the auxiliary transistors HT1 and HT2.

To explain more clearly the operation of the circuit of FIG. 2, it is now assumed that the signal A assumes a high level and thus turns on the transistor T1 via the current injector I1. Thus, one of its collectors takes over the current from the current injector I3, so that the transistor T2 in the lower stage no longer receives any base current. The other collector takes over the current from the current injector I2, so that the transistor T4 is cut-off and the current from the current injector I4 flows through the auxiliary transistor HT2 via the conductor Q to the transistor T3. As a result, the base of the transistor T2, via the collector of the transistor T3 which is connected thereto, is rapidly discharged and kept in the cut-off state, so that this edge of the signal A appears at the collector of the transistor T2 with a slight delay only. If the signal A subsequently assumes a low level again, the transistor T1 is turned off, so that the current injector I2 turns on the transistor T4 and takes over the current from the current injector I4. Now substantially no current flows through the auxiliary transistor HT2 via the conductor Q into the base and the one collector of the transistor T3, so that its other collector hardly draws any current. When the transistor T1 is turned off the current from the current injector I3 again flows via the auxiliary transistor HT1 and the conductor P into the base of the transistor T2 and thus rapidly turns on said transistor. Thus, this edge of the signal A also appears at the collector of the transistor T2 with a slight delay, so that the switching speed of the circuit is substantially increased.

Figure 3:
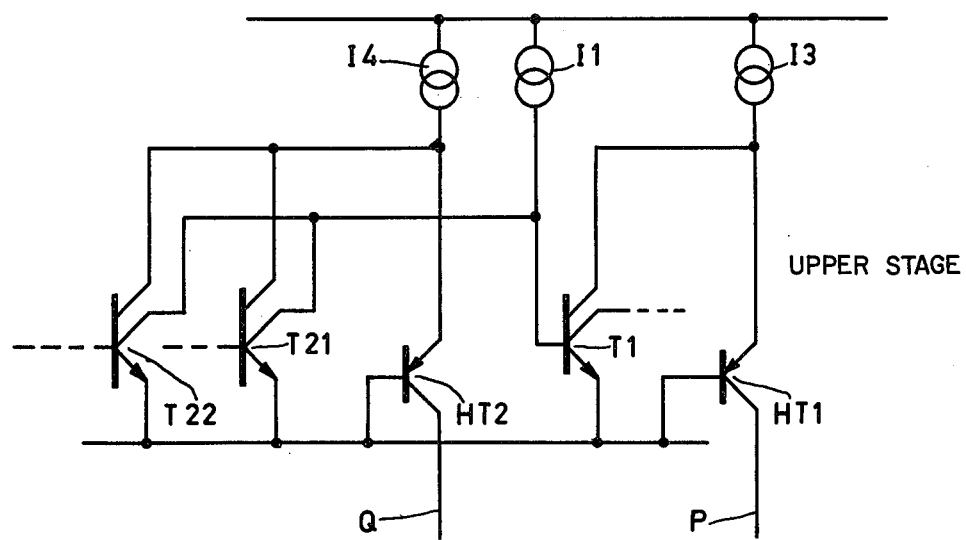
FIG. 3 shows a circuit arrangement of the invention employing a modification for controlling one of the auxiliary transistors.

In the present example, it will be noted that two complementary signals are needed, one, a normal signal, to control the first auxiliary transistor HT2, and a second, inverted signal to control the current mirror T3 via the second auxiliary transistor HT2. This signal inversion needed for the complementary control of the transistors T2 and T3 in the lower stage was effected by means of an additional transistor T4 serving as an inverter. As an alternative, the signal A in inverted form can be obtained without the use of a further inverter directly at the collector of the transistor T2, by reversing the connections between the collectors of the auxiliary transistors HT1 and HT2 and the bases of the transistors T2 and T3. Moreover, in many cases the controlling signal A is already available in the preceding circuit both in normal and inverted form, for example if the signal is produced by a flip-flop, so that the auxiliary transistors HT1 and HT2 can be controlled directly from additional collectors of the corresponding transistors in the preceding circuits. An example of such an at least partly quasi-direct control is shown in FIG. 3 which shows only the upper stage of the circuit, the lower stage being the same as in FIG. 2. To obtain a logic function a collector of each of the transistors T21 and T22 are connected to each other and to the current injector I1 and the base of the transistor T1, the result of the logic operation being available at the collector or collectors thereof. A further collector of the transistor T1 now controls the emitter of the auxiliary transistor HT1 which is connected to a current injector I3, as is described in FIG. 2 in order to transfer the result of the logic operation via the conductor P to the corresponding transistor in a lower stage. The emitter of the auxiliary transistor HT2 which is connected to the current injector I4, however, is directly controlled by additional collectors of the transistors T21 and T22 and the complementary result of the logic operation is thus transferred to the corresponding other transistor in the lower stage via the conductor Q. Thus, a special inverting transistor corresponding to the transistor T4 in FIG. 2 may be dispensed with. It is also possible that the mutually complementary signals, which are to be transferred to one layer, are derived from different layers situated above it where they exist. In principle it is also possible to employ the same control via auxiliary transistors and to use at least partly their direct control.

The current mirror whose operation was described in connection with FIG. 2 is, as such, well known in the art. Such circuits are sometimes referred to as current-controlled sources. See, for example, Philips Technical Review, Vol. 32, No. 1, pages 1–11 for a detailed description of the construction and operation of such circuits which function to cause the current in one conductor to identically follow the current in an adjacent conductor. In the present case, the current along conductor Q can be considered the reference current or the current mirror input, and the current mirror function to cause the current along the collector of T3, its output, connected to the conductor P to attempt to follow the input reference current. Due to activation of the current mirror by the inverted signal, a high level reference current along conductor Q is used to cause the switching transistor T2 to be selectively drained of stored charge when cut-off by a low level signal current along its drive conductor P.

The above cited embodiments are intended as exemplary only, and while we have described our invention with specific applications and embodiments thereof, other modifications will be apparent to those skilled in the art without departing from the spirit and scope of the invention as defined by the appended claims.

What is claimed is:

1. A circuit comprising
a voltage supply terminals;
a plurality of circuit stages including a first upper stage and a second lower stage connected in series across the voltage supply terminals;
said first upper stage including a first switching transistor of the first conductivity type having an emitter, a base and one or more collectors;
a first auxiliary transistor of the second conductivity type having an emitter, a base and a collector; a first signal input and a current injector being connected to said base of said first switching transistor; a collector of said first switching transistor being connected to the emitter of said first auxiliary transistor; the emitter of said first switching transistor and the base of said first auxiliary transistor being connected together;
said second lower stage including a second switching transistor of the first conductivity type having an emitter, a base and a collector, the collector of said first auxiliary transistor being connected to the base of said second switching transistor; and current mirror means connected to the base and the emitter of said second switching transistor which function to drain stored charge therefrom when the latter is turned off; the collector of said second switching transistor being connected to a signal output.

2. A circuit comprising
a voltage supply;
a plurality of circuit stages connected in series across said voltage supply including a first upper stage and a second lower stage, said first circuit stage comprising a current injector for supplying current thereto;
said first upper stage including a first switching transistor of a first conductivity type having an emitter, base and collector;
a first auxiliary transistor of a second conductivity type having an emitter, base and collector; a first signal input and said current injector connected to the base of said first switching transistor; the collector of said first switching transistor being connected to the emitter of said first auxiliary transistor; the emitter of said first switching transistor and the base of said first auxiliary transistor being connected;
said second lower stage including a second switching transistor of a first conductivity type having an emitter, base and collector; the collector of said first auxiliary transistor being connected to the base of said second switching transistor for turning on said second switching transistor when said signal input has a predetermined level; and current mirror means having a second input and connections to the base and the emitter of said second switching transistor for draining stored charge therefrom when the latter is turned off; the collector of said second switching transistor connected to a signal output; and means connected to said current mirror means for providing a signal current to said second input inverted with respect to the signal current on said first signal input.

3. A circuit comprising
a voltage supply;
a plurality of circuit stages connected in series across said voltage supply so as to include a first in the series defined as the highest stage, a last in the series defined as the lowest stage, higher and lower stages being defined as the higher stage being closer in the series to said highest stage than a lower stage, including a first upper stage and a second lower stage, each of said circuit stages comprising a current injector for supplying current thereto;
said first upper stage including a first switching transistor of a second conductivity type having an emitter, base and collector; a first and a second auxiliary transistor of a first conductivity type each having emitter, base and collector; a signal input and a first current injector connected to said base of said first switching transistor; and a second current injector connected to the emitter of said second auxiliary transistor; the collector of said first switching transistor being connected to the emitter of said first auxiliary transistor; the emitter of said first switching transistor and the base of said first and second auxiliary transistors being connected;
said second lower stage including a second switching transistor of the second conductivity type having emitter, base and collector, the collector of said first auxiliary transistor being connected to the base of said second switching transistor for turning on said second switching transistor when said signal input has predetermined level; and current mirror means having an input, and comprising a third transistor of the second conductivity type located in said second lower stage, said third transistor having a first collector constituting the current mirror output connected to the base of said second switching transistor for draining stored charge therefrom when the latter is turned off, a second collector connected to the base of said third transistor, and said emitter of said third transistor connected to the emitter of said second switching transistor; said collector of the second auxiliary transistor being connected to said current mirror input and means connected to said second auxiliary transistor for supplying a signal current to said second auxiliary transistor for supplying a signal current to said second auxiliary transistor inverted with respect to the signal current on said signal input.

4. A circuit as claimed in claim 3, wherein said means for supplying a signal to the second auxiliary transistor comprises a fourth transistor of the second conductivity type and located in a stage higher than that of said second stage.

5. A circuit as claimed in claim 3, wherein said first upper stage further comprises a third current injector, said third current injector being connected to a collector of the first transistor and to the emitter of the first auxiliary transistor, said second current injector in the first stage being connected to a collector of the fourth transistor, and the bases of the first and second axuiliary transistors and the emitter of the first transistor being connected to the emitter of said fourth transistor.

* * * * *

UNITED STATES PATENT AND TRADEMARK OFFICE
CERTIFICATE OF CORRECTION

PATENT NO. : 4,109,162

DATED : August 22, 1978

INVENTOR(S) : ROLF HEUSER ET AL

It is certified that error appears in the above-identified patent and that said Letters Patent are hereby corrected as shown below:

Claim 1, line 2, "a voltage" should be --voltage--

Claim 2, line 2, "a voltage supply;" should be --voltage supply terminals;--
line 4, "supply" should be --supply terminals--
line 10, "collector;" should be --collectors--
line 12, "base and collector;" should be --a base and a collector;--
line 19, "nected;" should be --nected together;--
line 21, "a" should be --the--
line 22, "base and collector;" should be --a base and a collector;--
line 29, "for draining" should be --which function to drain--
line 31, "transistor" should be --transistor being--

Claim 3, line 2, "a voltage supply" should be --voltage supply terminals--
line 4, "supply" should be --supply terminals--
line 14, "a" should be --the--
line 15, "base and collector;" should be --a base and one or more collectors;--
line 17, "emitter, base and collector;" should be --an emitter, a base and a collector;--
line 18, "injector" should be --injector being--
line 25, "connected;" should be --connected together;--
line 28, "emitter, base and collector," should be --an emitter, a base and a collector;--
line 30, "transistor for turning on" should be --transistor, said collector of said first auxiliary transistor functioning to turn on--
line 32, "has" should be --has a--
line 34, "type located" should be --type--
line 35, delete "in said second lower stage,"
line 38, "transistor for draining " should be --transistor, said first collector functioning to drain--

UNITED STATES PATENT AND TRADEMARK OFFICE
CERTIFICATE OF CORRECTION

PATENT NO. : 4,109,162

DATED : August 22, 1978

INVENTOR(S) : ROLF HEUSER ET AL

It is certified that error appears in the above-identified patent and that said Letters Patent are hereby corrected as shown below:

line 39, "the latter is turned off," should be --said second switching transistor is turned off;-- line 40, "collector" should be --collector being--

Claim 4, line 4, "type and" should be --type--

Signed and Sealed this

Twelfth Day of June 1979

[SEAL]

Attest:

RUTH C. MASON
*Attesting Officer*

DONALD W. BANNER
*Commissioner of Patents and Trademarks*